United States Patent
Awazu et al.

(10) Patent No.: US 11,962,904 B2
(45) Date of Patent: Apr. 16, 2024

(54) IMAGE BLUR CORRECTION DEVICE, IMAGING DEVICE, AND LENS DEVICE

(71) Applicant: FUJIFILM Corporation, Tokyo (JP)

(72) Inventors: Kouhei Awazu, Saitama (JP); Yasuhiro Miwa, Saitama (JP); Takuro Abe, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 283 days.

(21) Appl. No.: 17/479,488

(22) Filed: Sep. 20, 2021

(65) Prior Publication Data

US 2022/0006958 A1 Jan. 6, 2022

Related U.S. Application Data

(63) Continuation of application No. PCT/JP2020/015528, filed on Apr. 6, 2020.

(30) Foreign Application Priority Data

Apr. 25, 2019 (JP) ................................. 2019-084504

(51) Int. Cl.
*H04N 5/335* (2011.01)
*G02B 27/64* (2006.01)
(Continued)

(52) U.S. Cl.
CPC ......... *H04N 23/687* (2023.01); *G02B 27/646* (2013.01); *G01R 33/072* (2013.01);
(Continued)

(58) Field of Classification Search
CPC ............................ G01R 33/091; H04N 23/687
See application file for complete search history.

(56) References Cited

U.S. PATENT DOCUMENTS

| 9,426,371 B2 * | 8/2016 | Takeuchi ........... H04N 23/6812 |
| 2015/0365568 A1 | 12/2015 | Topliss et al. |
| 2017/0244899 A1 * | 8/2017 | Abe ...................... H04N 23/55 |

FOREIGN PATENT DOCUMENTS

| JP | 2009-53673 A | 3/2009 |
| JP | 2011-180519 A | 9/2011 |

(Continued)

OTHER PUBLICATIONS

International Search Report issued in PCT/JP2020/015528; dated Jun. 30, 2020.
(Continued)

*Primary Examiner* — Gary C Vieaux
(74) *Attorney, Agent, or Firm* — Studebaker & Brackett PC

(57) ABSTRACT

A first image blur correction device includes an imaging-element holding-member to which an imaging-element is fixed, a housing that supports the imaging-element holding-member to be movable in a direction X perpendicular to an optical axis of a lens device, and a first drive mechanism that generates thrust of moving the imaging-element holding-member in the direction X. The first drive mechanism includes a first magnet that is fixed to the housing and in which a direction connecting both magnetic poles is parallel to the direction X, and a first coil that is fixed to the imaging-element holding-member to face the first magnet. In a state where the imaging-element holding-member is at a reference position where the optical axis of the lens device coincides with a center of the imaging-element, a position of a first magnet center in the direction X and a first coil central axis deviate from each other.

10 Claims, 9 Drawing Sheets

(51) Int. Cl.
*H04N 23/68* (2023.01)
*G01R 33/07* (2006.01)
*G01R 33/09* (2006.01)
*G03B 5/02* (2021.01)

(52) U.S. Cl.
CPC .............. *G01R 33/091* (2013.01); *G03B 5/02* (2013.01); *G03B 2205/0007* (2013.01)

(56) References Cited

FOREIGN PATENT DOCUMENTS

| JP | 2016-509684 A | 3/2016 |
| JP | 2016-187276 A | 10/2016 |
| JP | 2017-146532 A | 8/2017 |

OTHER PUBLICATIONS

International Preliminary Report on Patentability and Written Opinion issued in PCT/JP2020/015528; dated Sep. 28, 2021.
An Office Action; "Notice of Reasons for Refusal," mailed by the Japanese Patent Office dated Jan. 4, 2023, which corresponds to Japanese Patent Application No. 2021-515951 and is related to U.S. Appl. No. 17/479,488; with English language translation.
An Office Action; "Notice of Reasons for Refusal," mailed by the Japanese Patent Office dated Nov. 8, 2022, which corresponds to Japanese Patent Application No. 2021-515951 and is related to U.S. Appl. No. 17/479,488; with English language translation.

\* cited by examiner

IMAGE BLUR CORRECTION DEVICE, IMAGING DEVICE, AND LENS DEVICE

CROSS-REFERENCE TO RELATED APPLICATIONS

This application is a Continuation of PCT International Application No. PCT/JP2020/015528 filed on Apr. 6, 2020, which claims priority under 35 U.S.C § 119(a) to Japanese Patent Application No. 2019-084504 filed on Apr. 25, 2019. Each of the above application(s) is hereby expressly incorporated by reference, in its entirety, into the present application.

BACKGROUND OF THE INVENTION

1. Field of the Invention

The present invention relates to an image blur correction device, an imaging device, and a lens device.

2. Description of the Related Art

As an imaging device including an imaging element that images a subject through an imaging optical system or a lens device that is mounted in such an imaging device for use, a device that has an image blur correction function of correcting blur (hereinafter, referred to as image blur) of an image formed in the imaging element by the imaging optical system caused by vibration of the device is known.

JP2009-53673A describes an image blur correction device that uses a voice coil motor as a drive source for moving a moved member at the time of image blur correction. The voice coil motor consists of a magnet, a coil facing the magnet, and a yoke.

SUMMARY OF THE INVENTION

An object of the present invention is to provide an image blur correction device capable of achieving improvement of thrust while suppressing an increase in size of the device, and an imaging device and a lens device comprising the image blur correction device.

An image blur correction device of the present invention is an image blur correction device that corrects blur of an image formed in an imaging element by an imaging optical system. The image blur correction device comprises a movable mechanism to which an optical component included in the imaging element or the imaging optical system is fixed, a support mechanism that supports the movable mechanism to be movable in a first direction perpendicular to an optical axis of the imaging optical system, and a first drive mechanism that generates thrust of moving the movable mechanism in the first direction. The first drive mechanism includes a first magnetic force generator that is fixed to one mechanism of the support mechanism and the movable mechanism and in which a direction connecting both magnetic poles is parallel to the first direction, and a first coil that is fixed to the other mechanism of the support mechanism and the movable mechanism to face the first magnetic force generator. In a state in which the movable mechanism is at a reference position where the optical axis of the imaging optical system coincides with a center of the imaging element, a position in the first direction of a center between both magnetic poles of the first magnetic force generator and a central axis of winding of the first coil deviate from each other.

An imaging device of the present invention is an imaging device comprising the image blur correction device. The imaging element is fixed to the movable mechanism.

A lens device of the present invention is a lens device comprising the image blur correction device. The optical component is fixed to the movable mechanism.

According to the present invention, it is possible to provide an image blur correction device capable of achieving improvement of thrust while suppressing an increase in size of the device, and an imaging device and a lens device comprising the image blur correction device.

DESCRIPTION OF THE PREFERRED EMBODIMENTS

Figure 1:
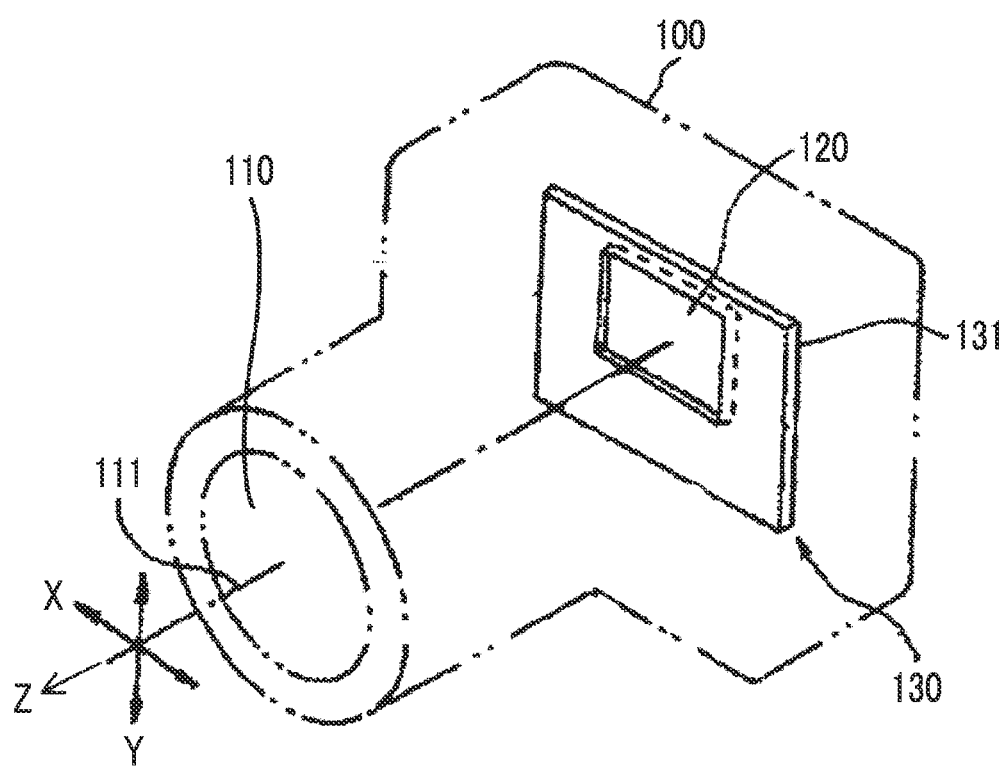
FIG. 1 is a transparent perspective view schematically showing an imaging device 100 comprising a first image blur correction device 130 that is a first embodiment of an image blur correction device of the present invention.

Hereinafter, embodiments of the present invention will be described referring to the drawings.

Imaging Device Comprising Image Blur Correction Device of First Embodiment

For example, a lens device performs image blur correction by detecting vibration of the device based on information from a movement detection sensor, such as an acceleration sensor or an angular velocity sensor mounted in the lens device, and moving a correction lens included in an imaging optical system within a plane perpendicular to an optical axis to counteract the detected vibration.

Furthermore, an imaging device performs image blur correction by detecting vibration of the device based on information from a movement detection sensor, such as an acceleration sensor or an angular velocity sensor mounted in the imaging device and moving one or both of a correction lens included in an imaging optical system and an imaging element within a plane perpendicular to an optical axis to counteract the detected vibration.

In a case where a voice coil motor is used to move one or both of the correction lens included in the imaging optical system and the imaging element within the plane perpendicular to the optical axis, in general, a configuration in which a magnet and a coil are disposed such that the center between both magnetic poles in the magnet and a central axis of winding of the coil overlap each other is commonly used to efficiently generate thrust.

In such a voice coil motor, in a case where a winding number of the coil is increased or the magnet is increased in size to obtain greater thrust, the image blur correction device including the voice coil motor is increased in size.

In a case where the image blur correction device is increased in size, the imaging device comprising the image blur correction device or the lens device comprising the image blur correction device is increased in size.

Although a technique for mounting a yoke in a narrow space with high density to achieve reduction in size of a drive mechanism while maintaining drive power is known, the technique does not take into consideration obtaining large thrust while suppressing an increase in size of the image blur correction device.

FIG. 1 is a transparent perspective view schematically showing an imaging device 100 comprising a first image blur correction device 130 that is a first embodiment of an image blur correction device of the present invention.

The imaging device 100 of FIG. 1 is a digital camera that stores an image formed in an imaging element 120 by the lens device 110 including a lens, a stop, and the like as digital image data. The imaging element 120 is configured with, for example, a solid-state imaging element, such as a complementary metal-oxide-semiconductor (CMOS)-type image sensor or a charge-coupled device (CCD)-type image sensor.

The imaging device 100 may be a still camera that stores data of a static image, may be a video camera that stores data of video, or may be a camera that has both functions.

The first image blur correction device 130 is mounted in the imaging device 100 and corrects image blur that occurs during exposure by the imaging element 120. Image blur is blurring of the image formed in the imaging element 120 by the lens device 110. Image blur occurs, for example, due to vibration of the imaging device 100 caused by shake or the like of a hand of a user who holds the imaging device 100.

In the embodiment, the first image blur correction device 130 performs so-called sensor shift-type image blur correction to correct image blur by moving the imaging element 120. A configuration in which so-called lens shift-type image blur correction to correct image blur by moving the lens included in the lens device 110 is performed will be described below referring to FIG. 9.

Here, a direction parallel to an optical axis 111 of the lens device 110 is referred to as a direction Z, a direction parallel to a longitudinal direction of the imaging element 120 between directions perpendicular to the direction Z is referred to as a direction X, and a direction perpendicular to the direction Z and the direction X is referred to as a direction Y. In the direction Y, upward in FIG. 1 is referred to as an upper side and downward in FIG. 1 is referred to as a lower side.

The first image blur correction device 130 correct image blur in the direction X and the direction Y by moving the imaging element 120 in the direction X and the direction Y. Alternatively, the first image blur correction device 130 may correct image blur in a rotation direction around the direction Z by rotating the imaging element 120 around an axis of the direction Z.

In the imaging device 100, each lens included in the lens device 110 configures an imaging optical system.

Figure 2:
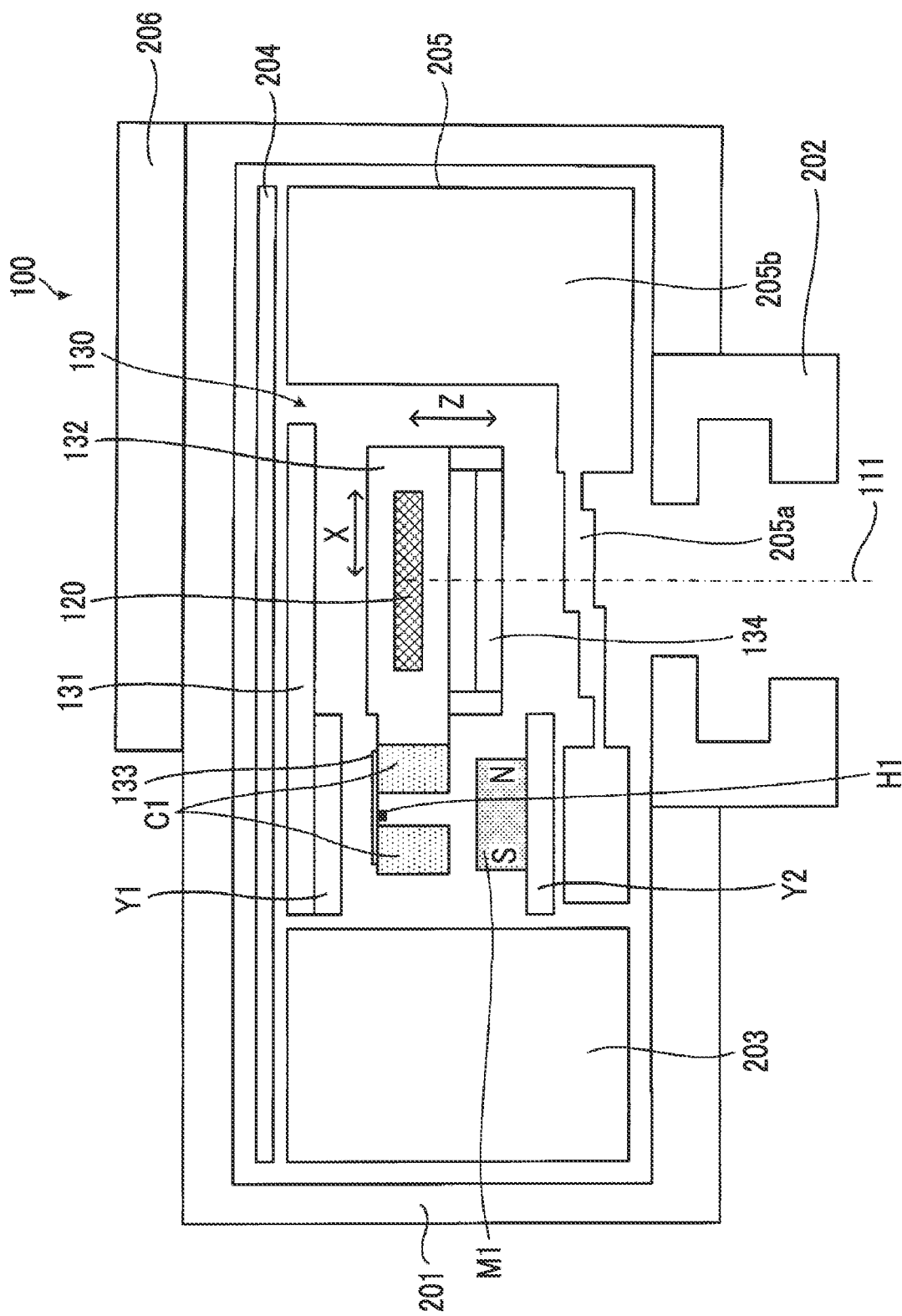
FIG. 2 is a schematic planar sectional view as the imaging device 100 of FIG. 1 is viewed in a direction Y from above.

FIG. 2 is a schematic planar sectional view as the imaging device 100 of FIG. 1 is viewed in the direction Y from above. The lens device 110 is omitted in FIG. 2. In FIG. 2, a cross section of the imaging device 100 passing through the optical axis 111 is shown.

The imaging device 100 comprises the lens device 110 (not shown), the imaging element 120, the first image blur correction device 130, a first housing 201, a first mount 202, a battery box 203, a first main board 204, a shutter unit 205, and a liquid crystal display 206. In an example shown in FIG. 2, the imaging device 100 is a body of a digital camera in which the lens device 110 is interchangeable. Note that the imaging device 100 may be a digital camera in which the body and the lens device 110 are integrated.

The first housing 201 houses components of the imaging device 100 including the imaging element 120, the first image blur correction device 130, the battery box 203, the first main board 204, the shutter unit 205, and the like.

The first mount 202 is provided as an opening portion of the first housing 201 and is a mechanism for attaching and detaching the lens device 110. The lens device 110 is connected to the first mount 202, whereby light passing through the lens device 110 is formed in the imaging element 120 as an image.

The battery box 203 houses a battery and supplies power to respective electronic components of the imaging device 100, such as the imaging element 120, the first image blur correction device 130, the first main board 204, the shutter unit 205, and the liquid crystal display 206.

The first main board 204 is a control circuit that controls the respective electronic components of the imaging device 100, such as the imaging element 120, the first image blur correction device 130, the first main board 204, the shutter unit 205, and the liquid crystal display 206.

The shutter unit 205 has a shutter section 205a that is provided between the first mount 202 and the imaging element 120, and a shutter drive section 205b that controls opening and closing of the shutter section 205a. The opening and closing of the shutter section 205a are controlled by the shutter drive section 205b, whereby a time for which the imaging element 120 is exposed to light passing through the lens device 110, that is, an exposure time is controlled.

The liquid crystal display 206 is provided on a surface opposite to a surface on which the first mount 202 is provided, in the external surface of the first housing 201. For example, the liquid crystal display 206 displays various kinds of setting information, such as an exposure value, an F number, a shutter speed, and sensitivity set in the imaging device 100, an image obtained by imaging, and the like to the user. The liquid crystal display 206 may be a touch panel that has a function of receiving an operation from the user through a touch operation along with the above-described display function.

The first image blur correction device 130 comprises a base 131, a first yoke Y1, a second yoke Y2, a first magnet M1, a first coil C1, an imaging element holding member 132, flexible printed circuits (FPC) 133, and a first hall element H1.

The base 131 is a rectangular flat plate-shaped member in which a thickness direction is parallel to the direction Z, and is provided in an end portion on the side of the liquid crystal display 206 in a space between the battery box 203 and the shutter drive section 205b where the first image blur correction device 130 is provided. The base 131 is fixed to the first housing 201. The first housing 201 and the base 131 support the imaging element holding member 132 to be movable in the direction X and the direction Y.

For example, a configuration can be made in which the imaging element holding member 132 is sandwiched in the direction Z by two fixing members (not shown) fixed to the first housing 201, and balls (not shown) are disposed between the two fixing members and the imaging element holding member 132. With this, the imaging element holding member 132 can be supported to be movable in the direction X and the direction Y.

In such a configuration, for example, a guide hole (not shown) that is opened on the side of the imaging element holding member 132 is provided in at least one of the two fixing members. A pin (not shown) that is inserted into the guide hole is provided in the imaging element holding member 132. With this, the imaging element holding member 132 is movable in the direction X and the direction Y in a range in which the pin of the imaging element holding member 132 moves inside the guide hole of the fixing member.

The first yoke Y1 and the second yoke Y2 are members for suppressing magnetic flux leakage of the first magnet M1. The first yoke Y1 is a rectangular flat plate-shaped member in which a thickness direction is parallel to the direction Z, and is fixed to the base 131. The second yoke Y2 is a rectangular flat plate-shaped member in which a thickness direction is parallel to the direction Z, and is fixed to the first housing 201 by a fixing member (not shown) to face the first yoke Y1.

The first magnet M1 is a permanent magnet and is fixed to a surface of the second yoke Y2 on a side facing the first yoke Y1. With this, the first magnet M1 is fixed to the first housing 201. The first magnet M1 is provided such that a direction connecting an N-pole and an S-pole (both magnetic poles) is the direction X. That is, the first magnet M1 is provided such that the N-pole and the S-pole are opposite sides in the direction X. In an example of FIG. 3, although the first magnet M1 is provided such that, in the X direction, the N-pole is on the side of the imaging element 120 and the S-pole is on the side of the battery box 203, the first magnet M1 may be provided with the positions of the N-pole and the S-pole replaced.

The first coil C1 is formed by winding an electric wire to which electric conduction is provided with a current output from the first FPC 133. The first coil C1 is fixed to the imaging element holding member 132 to face the first magnet M1 between the first yoke Y1 and the second yoke Y2. The first coil C1 is fixed at a position in the imaging element holding member 132 different from the imaging element 120 in the direction X. The first coil C1 is provided such that a central axis of winding is directed in the direction Y.

As described above, the imaging element holding member 132 is supported by the base 131 to be movable in the direction X and the direction Y. The imaging element holding member 132 supports the imaging element 120 at a position where an image is formed in the imaging element 120 by the lens device 110 attached to the first mount 202.

In the first image blur correction device 130, in a situation in which image blur does not occur in the imaging device 100, the position of the imaging element holding member 132 is controlled such that the optical axis 111 of the lens device 110 coincides with a center of the imaging element 120 in an XY plane. The position of the imaging element holding member 132 in this case is referred to as a reference position of the imaging element holding member 132.

In addition to the imaging element 120, the first coil C1, the first FPC 133, and the first hall element H1 are fixed to the imaging element holding member 132. As in the example of FIG. 2, a cover glass 134 that transmits light incident from the lens device 110 attached to the first mount 202 onto the imaging element 120 may be provided in the imaging element 120.

The first FPC 133 is provided in an end portion of the first coil C1 on a side opposite to an end portion facing the first magnet M1. Alternatively, the first FPC 133 may be provided in the imaging element holding member 132. The first FPC 133 makes a current flow in the first coil C1 under the control of the first main board 204. With this, magnetic force in the direction X can be generated with respect to the first coil C1 by magnetic force from the first magnet M1, and the imaging element holding member 132 can be moved in the direction X.

The first coil C1, the first magnet M1, the first yoke Y1, the second yoke Y2, and the first FPC 133 configure a voice coil motor XVCM that drives the imaging element holding member 132 in the direction X.

The first hall element H1 is fixed to a surface of the first FPC 133 on the side of the first magnet M1. In the example of FIG. 2, the first hall element H1 is fixed at a position that is a hollow portion of the first coil C1, in the surface of the first FPC 133. The first hall element H1 detects a magnetic field from the first magnet M1 and outputs a detection result of the magnetic field to the first FPC 133 in a form of an electric signal.

The first FPC 133 outputs the detection result of the magnetic field output from the first hall element H1, to the first main board 204. The first main board 204 detects a position of the imaging element holding member 132 in the direction X based on the detection result output from the first FPC 133. Then, the first main board 204 controls the position of the imaging element holding member 132 in the direction X by controlling the current flowing in the first coil C1 based on a detection result of the position in the direction X.

As shown in FIG. 2, the first image blur correction device 130 is provided between the battery box 203 and the shutter drive section 205b each having a large volume in the direction X. For this reason, the size of the first image blur correction device 130 in the direction X is significantly restricted. In the first image blur correction device 130, the first coil C1 is disposed in parallel with the imaging element 120 in the direction X, that is, in the longitudinal direction of the imaging element 120. Thus, the size of the first coil C1 in the direction X is significantly restricted.

In the first image blur correction device 130, the shapes and the sizes of the base 131, the imaging element holding member 132, the cover glass 134, and the like are not limited to those shown in the drawings, and can be any shapes or sizes.

In the first image blur correction device 130, the direction X configures a first direction, the direction Y configures a second direction, the imaging element holding member 132 configures a movable mechanism, the first housing 201 and the base 131 configure a support mechanism, the voice coil motor XVCM configures a first drive portion, the first magnet M1 configures a first magnetic force generator, the first coil C1 configures a first coil, and the first hall element H1 configures a magnetic field detection element.

Figure 3:
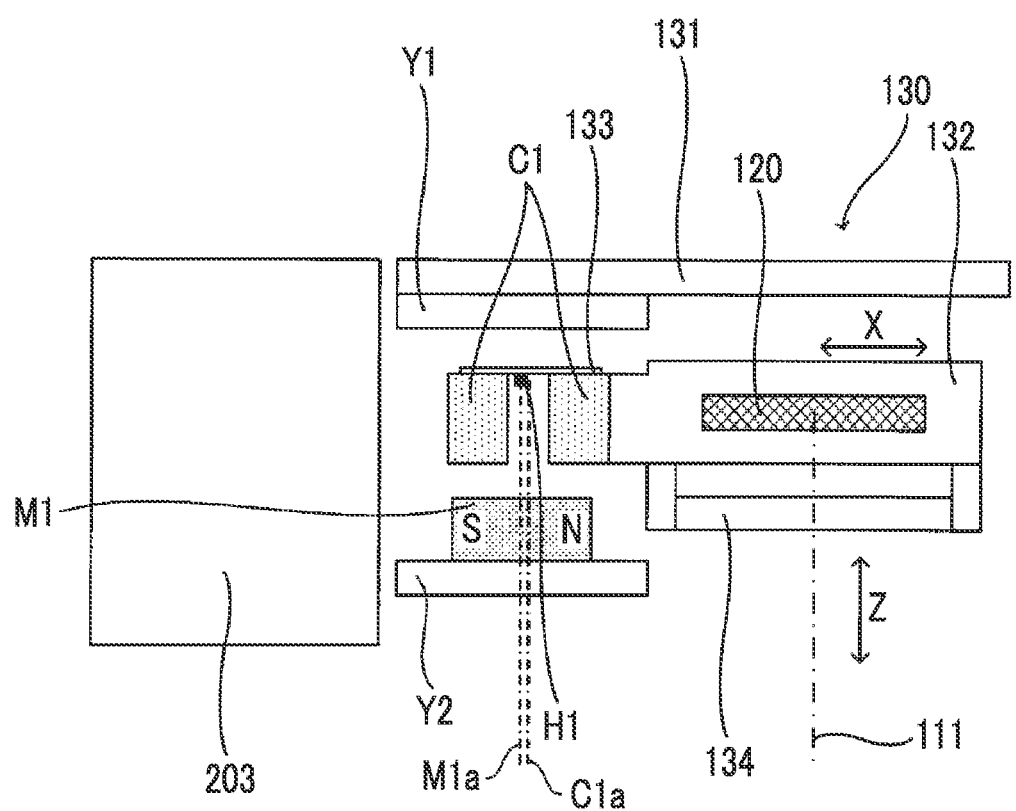
FIG. 3 is a schematic planar sectional view as the imaging element 120, the first image blur correction device 130, and a battery box 203 of FIG. 2 are viewed in the direction Y from above.

FIG. 3 is a schematic planar sectional view as the imaging element 120, the first image blur correction device 130, and the battery box 203 of FIG. 2 are viewed in the direction Y from above.

Figure 4:
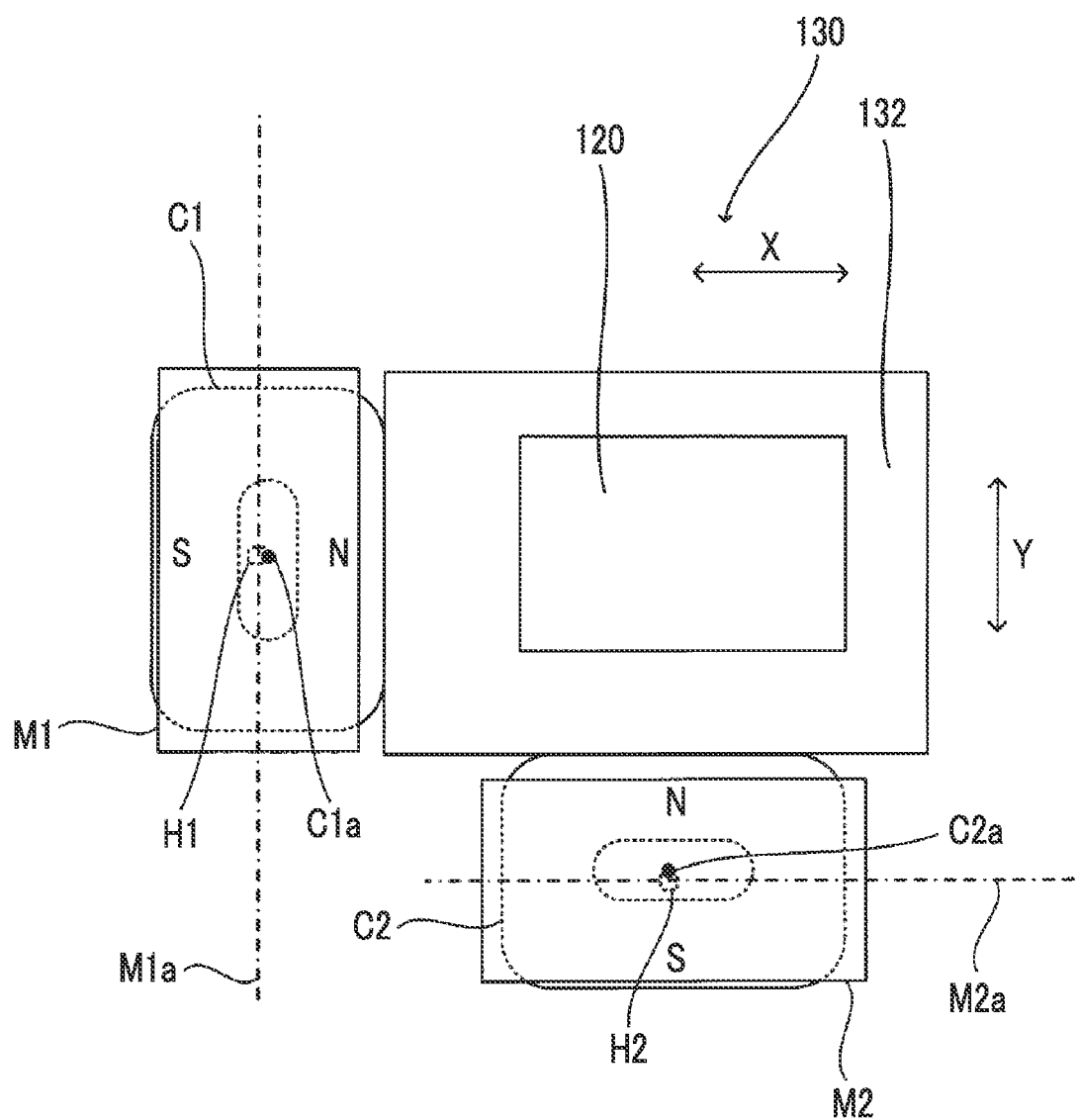
FIG. 4 is a schematic front view as the imaging element 120 and the first image blur correction device 130 of FIG. 2 are viewed in a direction Z from the side of a lens device 110.

FIG. 4 is a schematic front view as the imaging element 120 and the first image blur correction device 130 of FIG. 2 are viewed in the direction Z from the side of the lens device 110, in FIG. 4, the base 131, the first yoke Y1, the second yoke Y2, and the cover glass 134 are omitted.

A first magnet center M1a indicates the center between the N-pole and the S-pole (both magnetic poles) in the first magnet M1. The center between the N-pole and the S-pole is a plane including a middle point of each line of magnetic force between the N-pole and the S-pole.

A first coil central axis C1a. is the central axis of winding of the first coil C1. That is, the first coil C1 is configured by winding an electric wire around the first coil central axis C1a.

In the example of FIGS. 3 and 4, the imaging element holding member 132 is a state of being at the above-described reference position. In this state, the first coil central axis C1a deviates to the side of the imaging element 120 with respect to the first magnet center M1a in the direction X. With this, the first coil C1 can be made large to the inside (the side of the imaging element 120) of the first image blur correction device 130 without being made large to the outside (the side of the battery box 203) of the first image blur correction device 130, compared to a configuration of the related art in which the first coil central axis C1a does not deviate with respect to the first magnet center M1a in the direction X.

Accordingly, it is possible to increase a winding number of the first coil C1 while suppressing an increase in size of the first image blur correction device 130 and to increase the thrust of the voice coil motor XVCM. There is a decrease in thrust due to deviation of the first coil central axis C1a. with respect to the first magnet center M1a. However, an amount of the decrease in thrust is smaller than an amount of increase in thrust due to an increase in the winding number of the first coil C1. For this reason, as described below referring to FIG. 5, it is possible to increase the thrust of the voice coil motor XVCM as a whole.

In other words, in the embodiment, a slight decrease in thrust due to deviation of the first magnet center M1a and the first coil central axis C1a from each other is allowed, and the first coil C1 is increased in size toward the inside. In this manner, it is possible to considerably increase thrust with an increase in size of the first coil C1 while suppressing an increase in size of the first image blur correction device 130 due to an increase in size of the first coil C1 toward the outside, to improve thrust as a whole.

The first hall element H1 is provided at a position coinciding with the first magnet center M1a that is the center between the N-pole and the S-pole of the first magnet M1, in the direction X. With this, it is possible to improve linearity of position detection using the first hall element H1. The linearity of the position detection makes a radio of change in detection output of the first hall element H1 to change in position of the imaging element holding member 132 constant.

As shown in FIG. 4, the first image blur correction device 130 may comprise a voice coil motor YVCM including a second magnet M2 and a second coil C2, in addition to the voice coil motor XVCM. The voice coil motor YVCM is configured with the second coil C2, the second magnet M2, a third yoke (not shown), and a fourth yoke (not shown).

The third yoke and the fourth yoke are members for suppressing magnetic flux leakage of the second magnet M2. The third yoke is a rectangular flat plate-shaped member in which a thickness direction is parallel to the direction Z, and is fixed to the base 131. The fourth yoke is a rectangular flat plate-shaped member in which a thickness direction is parallel to the direction Z, and is fixed to the first housing 201 by a fixing member (not shown) to face the third yoke.

The second magnet M2 is a rectangular parallelepiped permanent magnet in which a thickness direction is parallel to the direction Z, and is fixed to a surface of the fourth yoke on a side facing the third yoke. The second magnet M2 is provided such that a direction connecting the N-pole and the S-pole is directed in the direction Y.

The second coil C2 is formed by winding an electric wire to which electric conduction is provided with a current output from a second FPC (not shown). The second coil C2 is fixed to the imaging element holding member 132 to face the second magnet M2 between the third yoke and the fourth yoke. The second coil C2 is provided such that a central axis of winding is directed in the direction Z.

In addition to the imaging element 120, the first coil C1, the first FPC 133, and the first hall element H1 described above, the second coil C2, the second FPC (not shown), and a second hall element H2 are fixed to the imaging element holding member 132.

The second FPC is provided in an end portion of the second coil C2 on a side opposite to an end portion facing the second magnet M2. Alternatively, the second FPC may be provided in the imaging element holding member 132. The second FPC makes a current flow in the second coil C2 under the control of the first main board 204. With this, magnetic force in the direction Y can be generated with respect to the second coil C2 by magnetic force from the second magnet M2, and the imaging element holding member 132 can be moved in the direction Y.

The second hall element H2 is fixed to a surface of the second FPC on the side of the second magnet M2. 1n the example of FIG. 4, the second hall element H2 is fixed at a position that is a hollow portion of the second coil C2, in the surface of the second FPC. The second hall element H2 detects a magnetic field from the second magnet M2 and outputs a detection result of the magnetic field to the second FPC.

The second FPC outputs the detection result of the magnetic field output from the second hall element H2, to the first main board 204. The first main board 204 detects a position of the imaging element holding member 132 in the direction Y based on the detection result output from the second FPC. Then, the first main board 204 controls the position of the imaging element holding member 132 in the direction Y by controlling the current flowing in the second coil C2 based on a detection result of the position in the direction Y.

A second magnet center M2a indicates the center between the N-pole and the S-pole (both magnetic poles) in the second magnet M2.

A second coil central axis C2a is a central axis of winding of the second coil C2. That is, the second coil C2 is configured by winding an electric wire around the second coil central axis C2a.

in a state in which the imaging element holding member 132 is at the above-described reference position, the second coil central axis C2a deviates to the side of the imaging element 120 with respect to the second magnet center M2a in the direction Y. With this, the second coil C2 can be made large to the inside (the side of the imaging element 120) of the first image blur correction device 130 without being made large to the outside (lower side) of the first image blur correction device 130, compared to a configuration of the related art in which the second coil central axis C2a, does not deviate with respect to the second magnet center M2a, in the direction Y.

Accordingly, it is possible to increase a winding number of the second coil C2 and to increase the thrust of the voice coil motor YVCM while suppressing an increase in size of the first image blur correction device 130. There is a decrease in thrust due to deviation of the second coil central axis C2a with respect to the second magnet center M2a. However, an amount of the decrease in thrust is smaller than an amount of increase in thrust due to an increase in the winding number of the second coil C2. For this reason, it is possible to increase the thrust of the voice coil motor YVCM as a whole.

In FIG. 4, the voice coil motor YVCM configures a second drive portion, the second magnet M2 configures a second magnetic force generator, and the second coil C2 configures a second coil.

Effects of Image Blur Correction Device of First Embodiment

In the first image blur correction device 130 configured as described above, the first coil central axis C1a deviates to the side of the imaging element 120 with respect to the first magnet center M1a in the direction X. In this manner, it is possible to increase the thrust of the voice coil motor XVCM while suppressing an increase in size of the first image blur correction device 130. The second coil central axis C2a deviates to the side of the imaging element 120 with respect to the second magnet center M2a in the direction Y, whereby it is possible to increase the thrust of the voice coil motor YVCM while suppressing an increase in size of the first image blur correction device 130.

Note that, for example, in a case where the size in the direction Y is not strictly restricted, a case where requested thrust of the voice coil motor YVCM is not large, or the like, a configuration may be made that the second coil central axis C2a does not deviate with respect to the second magnet center M2a in the direction Y.

Figure 5:
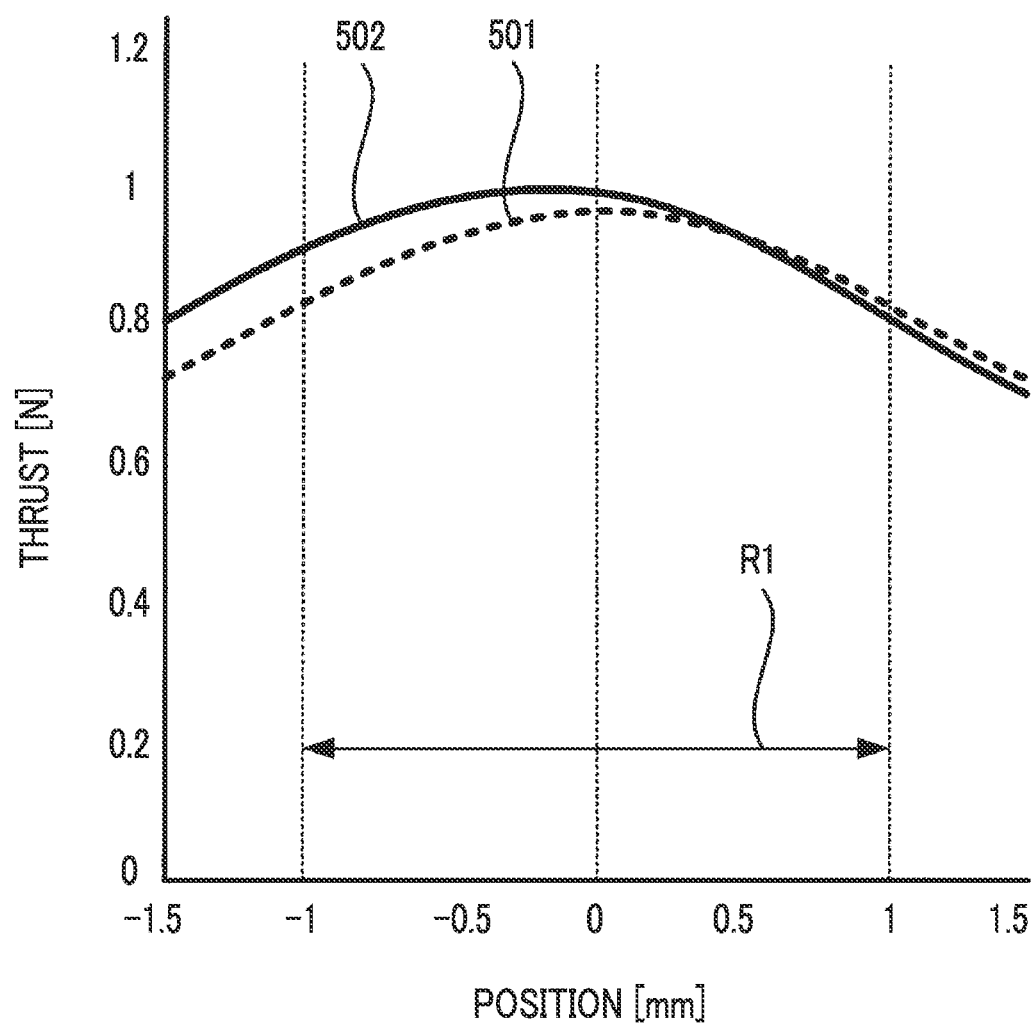
FIG. 5 is a graph showing an example of improvement of thrust by the first image blur correction device 130 of FIG. 1.

FIG. 5 is a graph showing an example of improvement of thrust by the first image blur correction device 130 of FIG. 1. The horizontal axis of FIG. 5 indicates the position of the imaging element holding member 132 in the direction X in terms of a distance [mm] from the above-described reference position. A control range R1 is a possible range of the position of the imaging element holding member 132 in control for image blur correction of the first image blur correction device 130. The vertical axis of FIG. 5 indicates thrust [N] for moving the imaging element holding member 132 in the direction X that is obtained by the voice coil motor XVCM.

A first position thrust characteristic 501 shows a relationship between the position of the imaging element holding member 132 and the thrust of the voice coil motor XVCM in the configuration of the related art for reference. The configuration of the related art is a configuration in which, when the imaging element holding member 132 is at the reference position, the first coil central axis C1a does not deviate with respect to the first magnet center M1a in the direction X. A position of an end portion in the first coil C1 on the side of the battery box 203 in the configuration of the related art is identical to a position of an end portion in the first coil C1 of the embodiment on the side of the battery box 203.

As shown in the first position thrust characteristic 501, in the configuration of the related art, the thrust of the voice coil motor XVCM is the highest when the distance from the reference position of the imaging element holding member 132 is 0 [mm], that is, the imaging element holding member 132 is at the reference position.

A second position thrust characteristic 502 shows a relationship between the position of the imaging element holding member 132 and the thrust of the voice coil motor XVCM in the embodiment. As shown in the second position thrust characteristic 502, in the embodiment, the thrust of the voice coil motor XVCM is the highest when the imaging element holding member 132 deviates to the side of the battery box 203 from the reference position. Then, as shown in the second position thrust characteristic 502, the average thrust of the voice coil motor XVCM is improved compared to the example of the first position thrust characteristic 501.

As shown in FIG. 5, in the embodiment, there is a decrease in thrust due to deviation of the first coil central axis C1a with respect to the first magnet center M1a. However, an amount of the decrease in thrust is smaller than an amount of increase in thrust due to an increase in the winding number of the first coil C1. For this reason, it is possible to increase the thrust of the voice coil motor XVCM as a whole.

Although an increase in thrust of the voice coil motor XVCM has been described, the same applies to an increase in thrust of the voice coil motor YVCM.

First Modification Example of Image Blur Correction Device of First Embodiment

Figure 6:
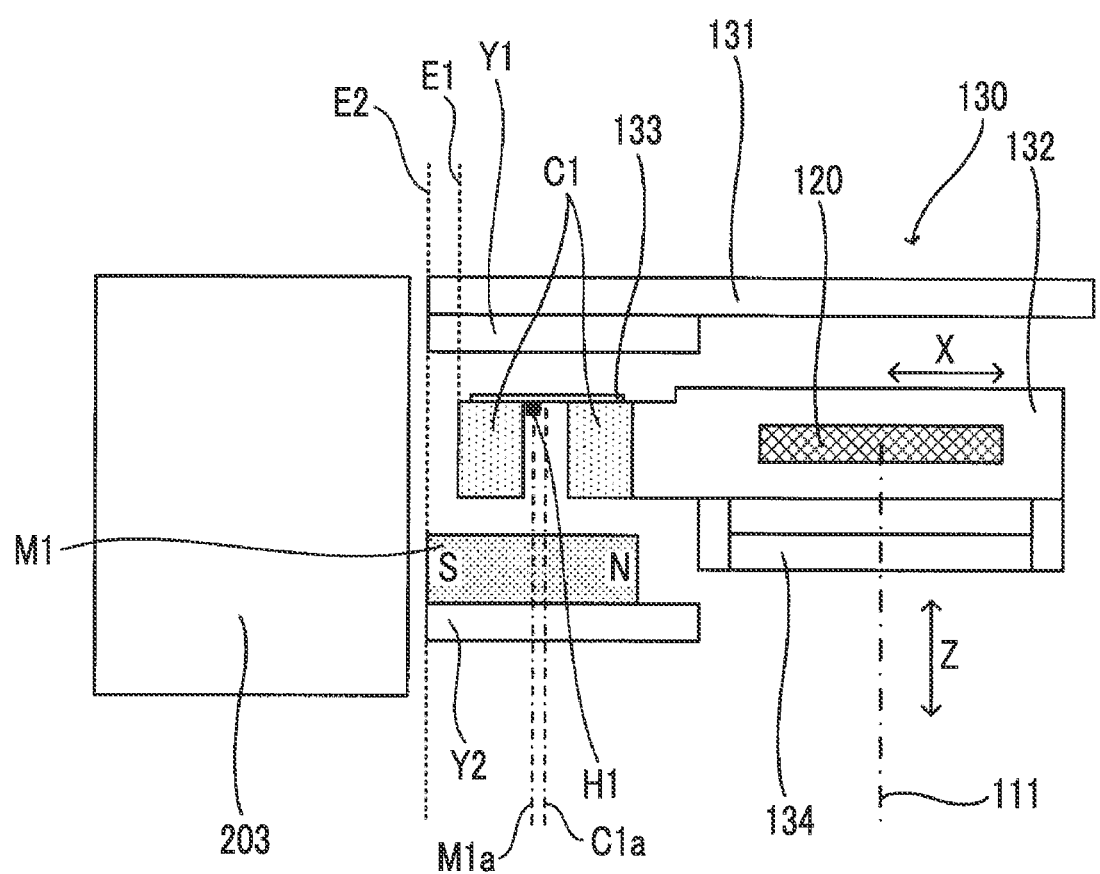
FIG. 6 is a diagram showing a first modification example of the first image blur correction device 130 of FIG. 1 and is a diagram corresponding to FIG. 3.

FIG. 6 is a diagram showing a first modification example of the first image blur correction device 130 of FIG. 1 and is a diagram corresponding to FIG. 3. In FIG. 6, the same components as shown in FIGS. 1 to 4 are represented by the same reference numerals.

A movable body end portion position E1 is a position in the direction X of an end portion in a movable body consisting of the imaging element holding member 132 and a member fixed to the imaging element holding member 132 on a side in a direction from the first coil central axis C1a, toward the first magnet center M1a in the direction X. That is, the movable body end portion position E1 is the position in the direction X of the end portion in the above-described movable body on the side of the battery box 203.

In the example of FIG. 6, the member fixed to the imaging element holding member 132 is the imaging element 120, the first coil C1, the first hall element H1, the first FPC 133, and the cover glass 134, and among these members, the first coil C1 is provided closest to the side of the battery box 203. Accordingly, the movable body end portion position E1 is the position in the direction X of the end portion in the first coil C1 on the side of the battery box 203.

A movable region end portion position E2 is a position in the direction X of an end portion in a region through which the movable body consisting of the imaging element holding member 132 and the member fixed to the imaging element holding member 132 is capable of passing, on the side of the battery box 203. That is, the movable region end portion position E2 is the position in the direction X of the end portion in a range through which the above-described movable body end portion position E1 can move with the drive of the voice coil motor XVCM, on the side of the battery box 203. The region through which the movable body consisting of the imaging element holding member 132 and the member fixed to the imaging element holding member 132 passes is required to be secured as a space for the first image blur correction device 130 inside the first housing 201 such that the movable body does not interfere with other components.

Positions in the direction X of end portions of the base 131, the first yoke Y1, and the second yoke Y2 on the side of the battery box 203 in the direction X coincide with the movable region end portion position E2.

The first image blur correction device 130 of the first modification example shown in FIG. 6 has the same configuration as in FIG. 3, excluding that a width in the direction X of the first magnet M1 is made large to the side of the battery box 203.

The first magnet M1 of FIG. 6 has the width in the direction X is made large to the side of the battery box 203 such that the position in the direction X of the end portion on the side of the battery box 203 coincides with the movable region end portion position E2, compared to the example of FIG. 3. As a result, the first magnet center M1a of FIG. 6 deviates to the side of the battery box 203 with respect to the first coil central axis C1a compared to the example of FIG. 3. With this, it is possible to make the first magnet M1 large to the side of the battery box 203 without enlarging a space for the first image blur correction device 130 inside the first housing 201, compared to the configuration of FIG. 3 in which the first magnet M1 is not provided to the movable region end portion position E2 in the direction X.

Accordingly, it is possible to increase the magnetic force of the first magnet M1 and to increase the thrust of the voice coil motor XVCM while suppressing an increase in size of the first image blur correction device 130. There is a decrease in thrust due to deviation of the first magnet center M1a with respect to the first coil central axis C1a. However, an amount of the decrease in thrust is smaller than an amount of increase in thrust due to an increase in magnetic force of the first magnet M1. For this reason, it is possible to increase the thrust of the voice coil motor XVCM as a whole.

With the first image blur correction device 130 of the first modification example, the first magnet 111 is provided to the movable region end portion position E2, whereby it is possible to make the first magnet M1 large such that the space for the first image blur correction device 130 inside the first housing 201 is not enlarged. For this reason, it is possible to increase the magnetic force of the first magnet M1 and to increase the thrust of the voice coil motor XVCM while suppressing an increase in size of the first image blur correction device 130.

Though not shown, the second magnet M2 may be provided to a position in the direction Y of an end portion in a region through which the movable body consisting of the imaging element holding member 132 and the member fixed to the imaging element holding member 132 passes, on a lower side. With this, it is possible to make the second magnet M2 large such that the space for the first image blur correction device 130 inside the first housing 201 is not enlarged. For this reason, it is possible to increase the magnetic force of the second magnet M2 and to increase the thrust of the voice coil motor YVCM while suppressing an increase in size of the first image blur correction device 130.

Second Modification Example of Image Blur Correction Device of First Embodiment

Figure 7:
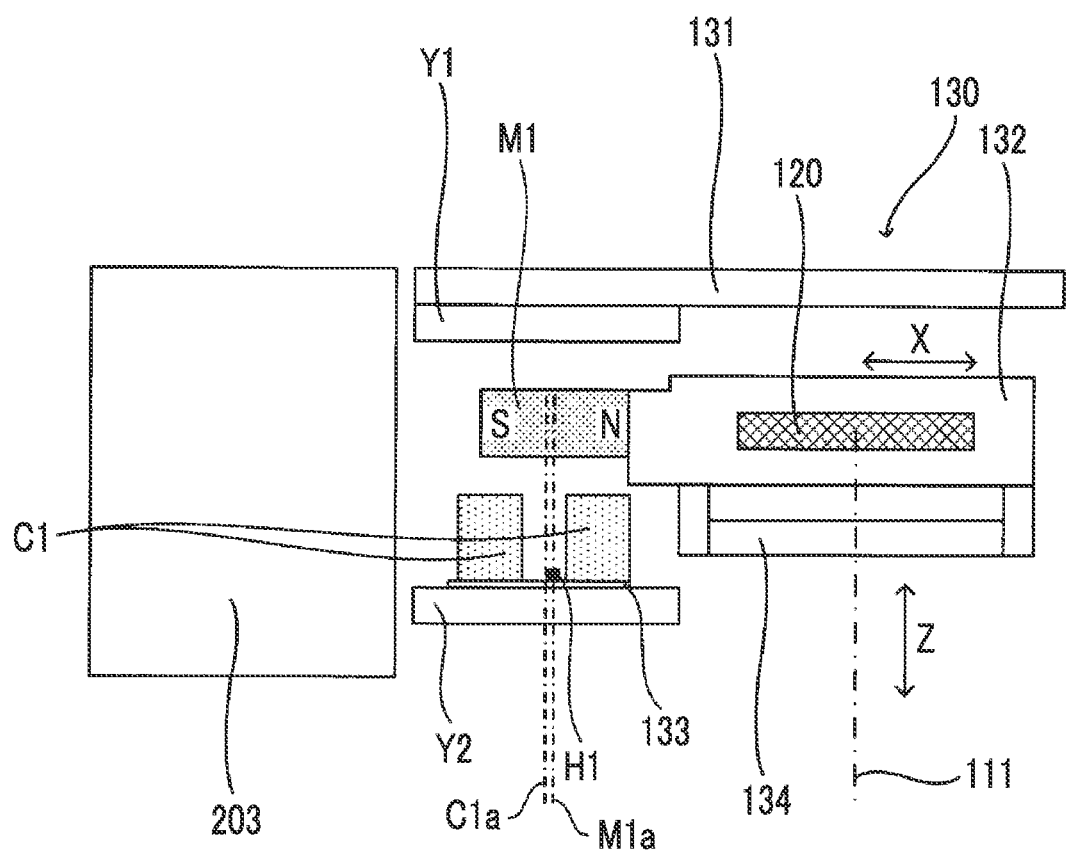
FIG. 7 is a diagram showing a second modification example of the first image blur correction device 130 of FIG. 1 and is a diagram corresponding to FIG. 3.

FIG. 7 is a diagram showing a second modification example of the first image blur correction device 130 of FIG. 1 and is a diagram corresponding to FIG. 3. In FIG. 7, the same components as those in FIGS. 1 to 4 are represented by the same reference numerals. The first image blur correction device 130 of the second modification example shown in FIG. 7 has the same configuration as in FIG. 3, excluding that the positions of the first magnet M1, the first coil C1, and the first hall element H1 are replaced.

In the first image blur correction device 130 of the second modification example, the first magnet M1 is fixed at a position in the imaging element holding member 132 different from the imaging element 120 in the direction X. The first coil C1 is fixed to the second yoke Y2 fixed to the first housing 201 side.

In the example of FIG. 7, the first FPC 133 and the first hall element H1 are also provided on the side of the second yoke Y2 along with the first coil C1.

Even in this example, the first coil C1, the first magnet M1, the first yoke Y1, the second yoke Y2, and the first FPC 133 configure the voice coil motor XVCM that drives the imaging element holding member 132 in the direction X.

In the example of FIG. 7, in a state in which the imaging element holding member 132 is at the reference position, the first magnet center M1a is positioned on the side of the imaging element 120 more than the first coil central axis C1a in the direction X.

With this, the first magnet M1 can be made large to the inside (the side of the imaging element 120) of the first image blur correction device 130 without being made large to the outside (the side of the battery box 203) of the first image blur correction device 130, compared to the configuration of the related art in which the first magnet center M1a does not deviate with respect to the first coil central axis C1a in the direction X. With this, it is possible to increase the magnetic force of the first magnet M1 and to increase the thrust of the voice coil motor XVCM while suppressing an increase in size of the first image blur correction device 130.

Similarly, the voice coil motor YVCM may also have a configuration in which the positions of the second magnet M2, the second coil C2, the second FPC (not shown), and the second hail element H2 are replaced in the example shown in FIG. 4.

Third Modification Example of Image Blur Correction Device of First Embodiment

Figure 8:
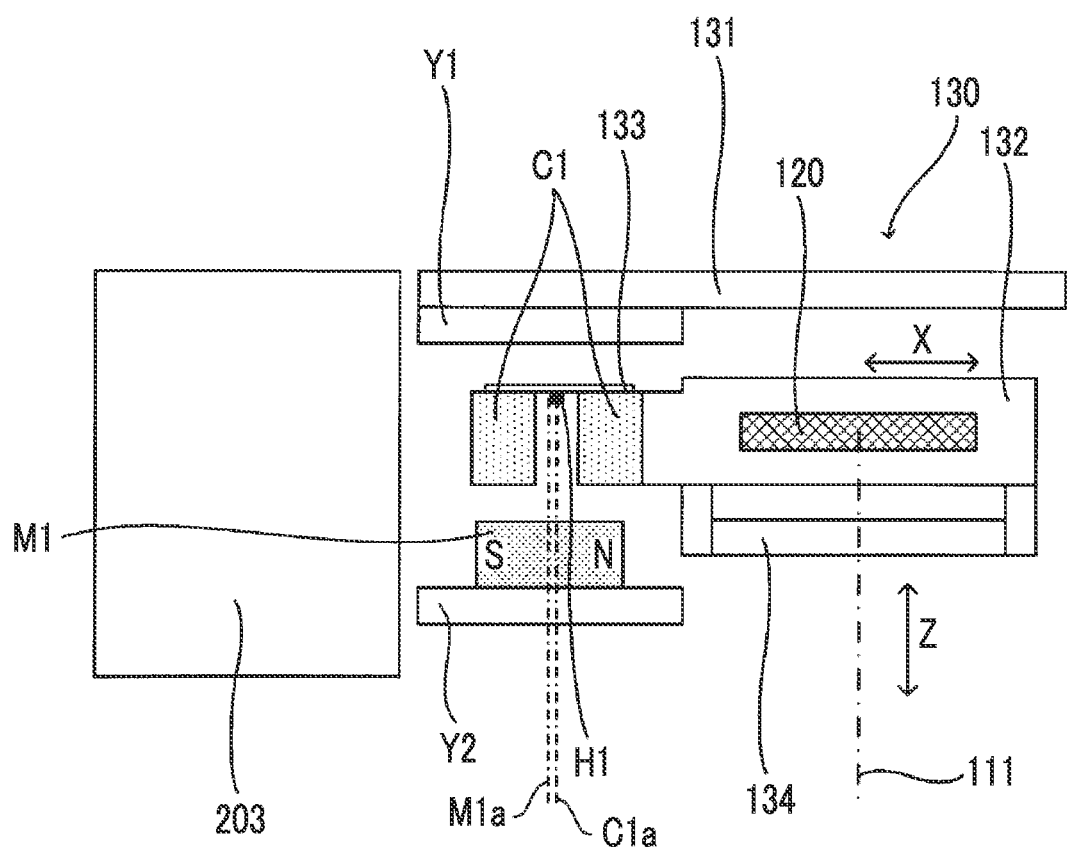
FIG. 8 is a diagram showing a third modification example of the first image blur correction device 130 of FIG. 1 and is a diagram corresponding to FIG. 3.

FIG. 8 is a diagram showing a third modification example of the first image blur correction device 130 of FIG. 1 and is a diagram corresponding to FIG. 3. In FIG. 8, the same components as those in FIGS. 1 to 4 are represented by the same reference numerals. The first image blur correction device 130 of the third modification example shown in FIG. 8 has the same configuration as in FIG. 3, excluding that the first hall element H1 is provided at a position coinciding with the first coil central axis C1a in the direction X.

The first hall element 141 is provided at the position coinciding with the first coil central axis C1a in the direction X, whereby it is possible to reduce the influence of noise received from the first coil C1 on the first hall element H1. With this, it is possible to improve the accuracy of detection of the magnetic field from the first magnet M1 by the first hall element H1.

Though not shown, a configuration may be made in which the second hall element H2 is provided at a position coinciding with the second coil central axis C2a in the direction Y in the example shown in FIG. 4. Accordingly, it is possible to reduce the influence of noise received from the second coil C2 on the second hall element 142. With this, it is possible to improve the accuracy of detection of the magnetic field from the second magnet M2 by the second hall element H2.

Combination of Respective Modification Examples of Image Blur Correction Device of First Embodiment The respective modification examples shown in FIGS. 6 to 8 can also be combined.

For example, in the example of FIG. 7, similarly to the example of FIG. 6, the first coil C1 fixed to the side of the second yoke Y2 may be provided to the position in the direction X of the end portion in the region through which the movable body consisting of the imaging element holding member 132 and the member fixed to the imaging element holding member 132 passes, on the side of the battery box 203. In the example of FIG. 7, the above-described movable body end portion position E1 is the position in the direction X of the end portion in the first magnet M1 on the side of the battery box 203.

In the example of FIG. 6 or 7, similarly to the example of FIG. 8, a configuration may be made in which the first hall element H1 is provided at the position coinciding with the first coil central axis C1a in the direction X.

Lens Device Comprising Image Blur Correction Device of Second Embodiment

Figure 9:
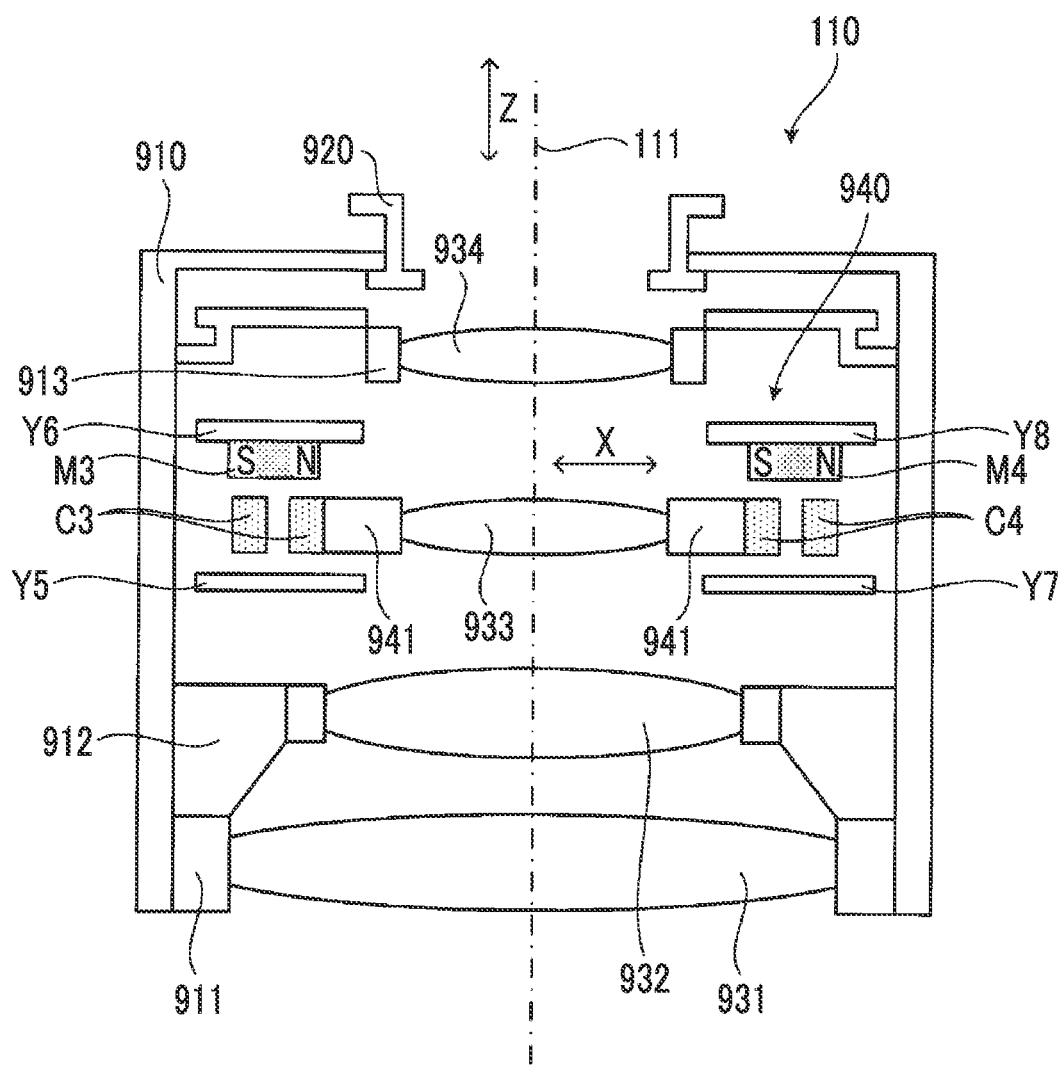
FIG. 9 is a schematic planar sectional view schematically showing a lens device 110 comprising a second image blur correction device 940 that is a second embodiment of an image blur correction device of the present invention.

FIG. 9 is a schematic planar sectional view schematically showing a lens device 110 comprising a second image blur correction device 940 that is a second embodiment of an image blur correction device of the present invention. The second image blur correction device 940 is provided in the lens device 110 and performs so-called lens shift-type image blur correction to correct image blur by moving lenses included in the lens device 110.

In the example of FIG. 9, the lens device 110 comprises a second housing 910, a second mount 920, a first lens 931, a second lens 932, a third lens 933, a fourth lens 934, the second image blur correction device 940, and a second main board (not shown).

The second housing 910 has a cylindrical shape and houses components, such as the first lens 931, the second lens 932, the third lens 933, the fourth lens 934, and the second image blur correction device 940.

The second mount 920 is provided as one opening portion of the second housing 910 having a cylindrical shape and is a mechanism for attaching and detaching the lens device 110 to the first mount 202 of the imaging device 100 of FIG. 2.

The first lens 931, the second lens 932, the third lens 933, and the fourth lens 934 configure an imaging optical system of the lens device 110. Among the lenses, the third lens 933 is an image blur correction lens. The first lens 931, the second lens 932, the third lens 933, the fourth lens 934, and the second mount 920 are disposed in this order along the direction Z that is the direction of the optical axis 111 of the imaging optical system.

The first lens 931, the second lens 932, and the fourth lens 934 are fixed to the second housing 910 by a first lens support mechanism 911, a second lens support mechanism 912, and a third lens support mechanism 913 fixed in the second housing 910, respectively.

The second image blur correction device 940 comprises a correction lens holding member 941, a fifth yoke Y5, a sixth yoke Y6, a third magnet M3, a third coil C3, a third FPC (not shown), a third hall element (not shown), a seventh yoke Y7, an eighth yoke Y8, a fourth magnet M4, a fourth coil C4, a fourth FPC (not shown), and a fourth hall element (not shown).

The fifth yoke Y5 and the sixth yoke Y6 are members for suppressing magnetic flux leakage of the third magnet M3. The fifth yoke Y5 is a rectangular flat plate-shaped member in which a thickness direction is parallel to the direction Z, and is fixed to the second housing 910 by a fixing member (not shown). The sixth yoke Y6 is a rectangular flat plate-shaped member in which a thickness direction is parallel to the direction Z, and is fixed to the second housing 910 by a fixing member (not shown) to face the fifth yoke Y5.

The third magnet M3 is a rectangular parallelepiped permanent magnet in which a thickness direction is parallel to the direction Z, and is fixed to a surface of the sixth yoke Y6 on a side facing the fifth yoke Y5. The third magnet M3 is provided such that a direction connecting the N-pole and the S-pole is directed in the direction X. In the example of FIG. 9, although the third magnet M3 is provided such that the N-pole is on the side of the third lens 933 in the direction X, the third magnet M3 may be provided with the positions of the N-pole and the S-pole replaced.

The third coil C3 is formed by winding an electric wire to which electric conduction is provided with a current output from the third FPC. The third coil C3 is fixed to the correction lens holding member 941 to face the third magnet M3 between the fifth yoke Y5 and the sixth yoke Y6. The third coil C3 is provided such that a central axis of winding is directed in the direction Z.

The correction lens holding member 941 is supported to be movable in the direction X and the direction Y with respect to the second housing 910. The correction lens holding member 941 supports the third lens 933.

In the second image blur correction device 940, in a state in which image blur does not occur in the imaging device 100 the position of the correction lens holding member 941 is controlled such that the optical axis 111 of the lens device 110 coincides with the center of the imaging element 120 in the XY plane. The position of the correction lens holding member 941 in this case is referred to as a reference position of the correction lens holding member 941.

In addition to the third lens 933, the third coil C3, the third FPC, and the third hall element are fixed to the correction lens holding member 941.

The third FPC is provided in an end portion in the third coil C3 on a side opposite to an end portion facing the third magnet M3. Alternatively, the third FPC may be provided in the correction lens holding member 941. The third FPC makes a current flow in the third coil C3 under the control of the second main board. With this, magnetic force in the direction X can be generated with respect to the third coil C3 by magnetic force from the third magnet M3, and the correction lens holding member 941 can be moved in the direction X.

The third coil C3, the third magnet M3, the fifth yoke Y5, the sixth yoke Y6, and the third FPC configure a voice coil motor XVCM1 that drives the correction lens holding member 941 in the direction X.

The third hall element is fixed to a surface in the third FPC on the side of the third magnet M3. The third hall element is fixed at a position in the surface of the third FPC that is a hollow portion of the third coil C3. The third hall element detects a magnetic field from the third magnet M3 and outputs a detection result of the magnetic field to the third FPC in a form of an electric signal.

The third FPC outputs the detection result of the magnetic field output from the third hall element, to the second main board. The second main board detects a position of the correction lens holding member 941 in the direction X based on the detection result output from the third FPC. Then, the second main board controls the position of the correction lens holding member 941 in the direction X by controlling the current flowing in the third coil C3 based on a detection result of the position in the direction X.

In the example of FIG. 9, the correction lens holding member 941 is in a state of being at the above-described reference position. In this state, the central axis of the winding of the third coil C3 deviates to the side of the third lens 933 with respect to the center between both magnetic poles in the third magnet M3, in the direction X.

With this, the third coil C3 can be prevented from being made large to the outside (a direction away from the optical axis 111) of the second image blur correction device 940, and the third coil C3 can be made large to the inside (the side of the third lens 933) of the second image blur correction device 940. Accordingly, it is possible to increase a winding number of the third coil C3 and to increase the thrust of the voice coil motor XVCM1 while suppressing an increase in size of the second image blur correction device 940.

The seventh yoke Y7, the eighth yoke Y8, the fourth magnet M4, the fourth coil C4, the fourth FPC, and the fourth hall element have the same configurations as the fifth yoke Y5, the sixth yoke Y6, the third magnet M3, the third coil C3, the third FPC, and the third hall element, respectively. Then, the seventh yoke Y7, the eighth yoke Y8, the fourth magnet M4, the fourth coil C4, the fourth FPC, and the fourth hall element generate thrust for moving the correction lens holding member 941 in the direction X under the control of the second main board. In regard to the fourth magnet M4, in the example of FIG. 9, although the fourth magnet M4 such that the S-pole is on the side of the third lens 933 in the direction X, the fourth magnet M4 may be provided with the positions of the N-pole and the S-pole replaced.

The fourth coil C4, the fourth magnet M4, the seventh yoke Y7, the eighth yoke Y8, and the fourth FPC configure a voice coil motor XVCM2 that drives the correction lens holding member 941 in the direction X. It is possible to increase thrust for moving the correction lens holding member 941 in the direction X by combining the voice coil motor XVCM2 and the above-described voice coil motor XVCM1. Note that the lens device 110 may have a configuration in which the voice coil motor XVCM1 or the voice coil motor XVCM2 is omitted.

Although a configuration in which the control of the second image blur correction device 940 is performed by the second main board of the lens device 110 has been described, a configuration may be made in which the control of the second image blur correction device 940 is performed by the first main board 204 of the imaging device 100.

In the second image blur correction device 940, the shapes or the sizes of the correction lens holding member 941 and the like are not limited to those shown in the drawings, and can be any shapes or sizes.

The lens device 110 comprises a voice coil motor YVCM1 that generates thrust for moving the correction lens holding member 941 in the Y-direction. The voice coil motor YVCM1 has the same configuration as the voice coil motor YVCM described referring to FIG. 4, for example.

Each configuration of the first image blur correction device 130 described referring to FIGS. 2 to 8 can also be applied to the second image blur correction device 940 of FIG. 9. In the second embodiment where the second image blur correction device 940 is provided in the lens device 110, a configuration may be made in which the first image blur correction device 130 of the imaging device 100 is omitted and the imaging element holding member 132 is fixed to the first housing 201.

In the second image blur correction device 940, the third lens 933 configures an optical component, the second housing 910 configures a support mechanism, the correction lens holding member 941 configures a movable mechanism, the voice coil motor XVCM1 and the voice coil motor XVCM2 configure a first drive portion, the third magnet M3 and the fourth magnet M4 configure a first magnetic force generator, the third coil C3 and the fourth coil C4 configure a first coil, and the third hall element and the fourth hall element configure a magnetic field detection element.

Effects of Image Blur Correction Device of Second Embodiment

In the second image blur correction device 940 configured as described above, similarly to the first image blur correction device 130, it is possible to increase the thrust of the voice coil motor while suppressing an increase in size of the second image blur correction device 940.

For example, in the lens device 110, although the voice coil motor is disposed on an outer periphery side of the third lens 933 as viewed in the direction Z, there is a need to make the third lens 933 large to improve optical performance or to improve anti-vibration performance. For this reason, the voice coil motor of the lens device 110 is required to be provided in a small space of an outer peripheral portion of the large third lens 933 and to generate large thrust to move the third lens 933 that is heavy due to a large size.

In contrast, the second image blur correction device 940 can have a small size and can generate large thrust. For this reason, it is possible to make the third lens 933 of the lens device 110 large and to achieve improvement of optical performance or anti-vibration performance of the lens device 110.

In the respective embodiments described above, although the imaging device 100 that is a digital camera has been described, the present invention can also be applied to an imaging device mounted in various devices, such as a smartphone, a tablet terminal, and a wearable terminal.

In the embodiment, although a hall element, such as the first hall element H1, has been described as an example of a magnetic field detection element, the magnetic field detection element is not limited to the hall element. For example, the magnetic field detection element can be various magnetic sensors capable of detecting a magnetic field, such as a magneto resistive (MR) sensor or a magnetic impedance element, other than the hall element.

As described above, at least the following matters are described in the specification.

(1) An image blur correction device that corrects blur of an image formed in an imaging element by an imaging optical system, the image blur correction device including a movable mechanism to which an optical component included in the imaging element or the imaging optical system is fixed, a support mechanism that supports the movable mechanism to be movable in a first direction perpendicular to an optical axis of the imaging optical system, and a first drive portion that generates thrust of moving the movable mechanism in the first direction, in which the first drive portion includes a first magnetic force generator that is fixed to one portion of the support mechanism and the movable mechanism and in which a direction connecting both magnetic poles is parallel to the first direction, and a first coil that is fixed to the other portion of the support mechanism and the movable mechanism to face the first magnetic force generator, and in a state in which the movable mechanism is at a reference position where the optical axis of the imaging optical system coincides with a center of the imaging element, a position in the first direction of a center between both magnetic poles of the first magnetic force generator and a central axis of winding of the first coil deviate from each other.

(2) The image blur correction device described in (1), in which the first coil is fixed at a position in the movable mechanism different from the imaging element or the optical component fixed to the movable mechanism in the first direction, the first magnetic force generator is fixed to the support mechanism, and in a state in which the movable mechanism is at the reference position, the central axis of the winding of the first coil is positioned on a side of the imaging. element or the optical component fixed to the movable mechanism with respect to the center between both magnetic poles of the first magnetic force generator, in the first direction.

(3) The image blur correction device described in (2), in which a position in the first direction of an end portion in the first magnetic force generator, on a side in a direction from the central axis of the winding of the first coil toward the center between both magnetic poles of the first magnetic force generator in the first direction, coincides with a position in the first direction of an end portion in a region through which a movable body consisting of a member fixed to the movable mechanism and the movable mechanism is capable of passing, on the side in the direction from the central axis of the winding of the first coil toward the center between both magnetic poles of the first magnetic force generator in the first direction.

(4) The image blur correction device described in (1), in which the first magnetic force generator is fixed at a position movable mechanism different from the imaging element or the optical component fixed in the movable mechanism in the first direction, the first coil is fixed to the support mechanism, and in a state in which the movable mechanism is at the reference position, the center between both magnetic poles of the first magnetic force generator is positioned on the side of the imaging element or the optical component fixed to the movable mechanism from the central axis of the winding of the first coil in the first direction.

(5) The image blur correction device described in (4), in which a position in the first direction of an end portion in the first coil, on a side in a direction from the center between both magnetic poles of the first magnetic force generator toward the central axis of the winding of the first coil in the first direction, coincides with a position in the first direction of an end portion in a region through which a movable body consisting of the movable mechanism and a member fixed to the movable mechanism is capable of passing, on the side in the direction from the center between both magnetic poles of the first magnetic force generator toward the central axis of the winding of the first coil in the first direction.

(6) The image blur correction device described in any one of (1) to (5), further including a magnetic field detection element that is fixed to one portion of the support mechanism and the movable mechanism to which the first coil is fixed, and detects a position of the movable mechanism in the first direction where a magnetic field from the first magnetic force generator is detected, in which the magnetic field detection element is configured such that a position in the first direction coincides with the center between both magnetic poles of the first magnetic force generator in a state in which the movable mechanism is at the reference position.

(7) The image blur correction device described in any one of (1) to (5), further including a magnetic field detection element that is fixed to one portion of the support mechanism and the movable mechanism to which the first coil is fixed, and detects a position of the movable mechanism in the first direction where a magnetic field from the first magnetic force generator is detected, in which the magnetic field detection element is configured such that a position in the first direction coincides with the central axis of the winding of the first coil in a state in which the movable mechanism is at the reference position.

(8) The image blur correction device described in any one of (1) to (7), in which the imaging element is fixed to the movable mechanism, and the first direction is parallel to a longitudinal direction of the imaging element.

(9) The image blur correction device described in any one of (1) to (8), in which the support mechanism supports the movable mechanism to be movable in the first direction and a second direction perpendicular to the optical axis of the imaging optical system and the first direction, the image blur correction device further includes a second drive portion that generates thrust of moving the movable mechanism in the second direction, the second drive portion includes a second magnetic force generator that is fixed to one portion of the support mechanism and the movable mechanism and in which a direction connecting bath magnetic poles is parallel to the second direction, and a second coil that is fixed to the other portion of the support mechanism and the movable mechanism to face the second magnetic force generator, and in a state in which the movable mechanism is at the reference position, a position of a center between both magnetic poles of the second magnetic force generator in the second direction coincides with a central axis of winding of the second coil.

(10) An imaging device including the image blur correction device described in any one of (1) to (9), in which the imaging element is fixed to the movable mechanism.

(11) A lens device including the image blur correction device described in any one of (1) to (9), in which the optical component is fixed to the movable mechanism.

The present invention is highly convenient and effective in a case of being applied to a digital camera, such as a single lens reflex camera or a mirrorless camera, an in-vehicle camera, a surveillance camera, or a smartphone.

EXPLANATION OF REFERENCES

100: imaging device
110: lens device
111: optical axis
120: imaging element
130: first image blur correction device
131: base
132: imaging element holding member
133: first FPC
134: cover glass
Y1 : first yoke
Y2: second yoke
C1: first coil
M1: first magnet
H1: first hall element
201: first housing
202: first mount
203: battery box 204: first main board
205: shutter unit
205a: shutter section
205b: shutter drive section
206: liquid crystal display
M1a: first magnet center
C1a: first coil central axis
C2: second coil
M2: second magnet
142: second hall element
M2a: second magnet center
C2a: second coil central axis
501: first position thrust characteristic
502: second position thrust characteristic
R1: control range
E1: movable body end portion position
E2: movable region end portion position
910: second housing
911: first lens support mechanism
913: third lens support mechanism
920: second mount
931: first lens
932: second lens
933: third lens
934: fourth lens
940: second image blur correction device
941: correction lens holding member
Y5: fifth yoke
Y6: sixth yoke
Y7: seventh yoke
Y8: eighth yoke
C3: third coil
C4: fourth coil
M3: third magnet
M4: fourth magnet

What is claimed is:

1. An image blur correction device that corrects blur of an image formed in an imaging element by an imaging optical system, the image blur correction device comprising:
   a movable mechanism to which an optical component included in the imaging element or the imaging optical system is fixed;
   a support mechanism that supports the movable mechanism to be movable in a first direction perpendicular to an optical axis of the imaging optical system; and
   a first drive mechanism that generates thrust of moving the movable mechanism in the first direction,
   wherein the first drive mechanism includes a first magnetic force generator that is fixed to one mechanism of the support mechanism and the movable mechanism and in which a direction connecting both magnetic poles is parallel to the first direction, and a first coil that is fixed to the other mechanism of the support mechanism and the movable mechanism to face the first magnetic force generator,
   in a state in which the movable mechanism is at a reference position where the optical axis of the imaging optical system coincides with a center of the imaging element, a position in the first direction of a center between both magnetic poles of the first magnetic force generator and a central axis of winding of the first coil deviate from each other,
   the first coil is fixed at a position in the movable mechanism different from the imaging element or the optical component fixed to the movable mechanism in the first direction,
   the first magnetic force generator is fixed to the support mechanism,
   in a state in which the movable mechanism is at the reference position, the central axis of the winding of the first coil is positioned on a side of the imaging element or the optical component fixed to the movable mechanism with respect to the center between both magnetic poles of the first magnetic force generator, in the first direction, and
   a position in the first direction of an end portion in the first magnetic force generator, on a side in a direction from the central axis of the winding of the first coil toward the center between both magnetic poles of the first magnetic force generator in the first direction, coincides with a position in the first direction of an end portion in a region through which a movable body consisting of a member fixed to the movable mechanism and the movable mechanism is capable of passing, on the side in the direction from the central axis of the winding of the first coil toward the center between both magnetic poles of the first magnetic force generator in the first direction.

2. The image blur correction device according to claim 1, further comprising:
   a magnetic field detection element that is fixed to one mechanism of the support mechanism and the movable mechanism to which the first coil is fixed, and detects a position of the movable mechanism in the first direction where a magnetic field from the first magnetic force generator is detected,
   wherein the magnetic field detection element is configured such that a position in the first direction coincides with the center between both magnetic poles of the first magnetic force generator in a state in which the movable mechanism is at the reference position.

3. The image blur correction device according to claim 1, further comprising:
   a magnetic field detection element that is fixed to one mechanism of the support mechanism and the movable mechanism to which the first coil is fixed, and detects a position of the movable mechanism in the first direction where a magnetic field from the first magnetic force generator is detected,
   wherein the magnetic field detection element is configured such that a position in the first direction coincides with the central axis of the winding of the first coil in a state in which the movable mechanism is at the reference position.

4. The image blur correction device according to claim 1, wherein the imaging element is fixed to the movable mechanism, and
   the first direction is parallel to a longitudinal direction of the imaging element.

5. An imaging device comprising:
   the image blur correction device according to claim 1, wherein the imaging element is fixed to the movable mechanism.

6. A lens device comprising:
   the image blur correction device according to claim 1, wherein the optical component is fixed to the movable mechanism.

7. An image blur correction device that corrects blur of an image formed in an imaging element by an imaging optical system, the image blur correction device comprising:
   a movable mechanism to which an optical component included in the imaging element or the imaging optical system is fixed;

a support mechanism that supports the movable mechanism to be movable in a first direction perpendicular to an optical axis of the imaging optical system; and a first drive mechanism that generates thrust of moving the movable mechanism in the first direction, wherein the first drive mechanism includes a first magnetic force generator that is fixed to one mechanism of the support mechanism and the movable mechanism and in which a direction connecting both magnetic poles is parallel to the first direction, and a first coil that is fixed to the other mechanism of the support mechanism and the movable mechanism to face the first magnetic force generator, in a state in which the movable mechanism is at a reference position where the optical axis of the imaging optical system coincides with a center of the imaging element, a position in the first direction of a center between both magnetic poles of the first magnetic force generator and a central axis of winding of the first coil deviate from each other, the first magnetic force generator is fixed at a position in the movable mechanism different from the imaging element or the optical component fixed to the movable mechanism in the first direction, the first coil is fixed to the support mechanism, in a state in which the movable mechanism is at the reference position, the center between both magnetic poles of the first magnetic force generator is positioned on the side of the imaging element or the optical component fixed to the movable mechanism from the central axis of the winding of the first coil in the first direction, and a position in the first direction of an end portion in the first coil, on a side in a direction from the center between both magnetic poles of the first magnetic force generator toward the central axis of the winding of the first coil in the first direction, coincides with a position in the first direction of an end portion in a region through which a movable body consisting of the movable mechanism and a member fixed to the movable mechanism is capable of passing, on the side in the direction from the center between both magnetic poles of the first magnetic force generator toward the central axis of the winding of the first coil in the first direction.

8. The image blur correction device according to claim 7, further comprising:

a magnetic field detection element that is fixed to one mechanism of the support mechanism and the movable mechanism to which the first coil is fixed, and detects a position of the movable mechanism in the first direction where a magnetic field from the first magnetic force generator is detected, wherein the magnetic field detection element is configured such that a position in the first direction coincides with the center between both magnetic poles of the first magnetic force generator in a state in which the movable mechanism is at the reference position.

9. The image blur correction device according to claim 7, further comprising:

a magnetic field detection element that is fixed to one mechanism of the support mechanism and the movable mechanism to which the first coil is fixed, and detects a position of the movable mechanism in the first direction where a magnetic field from the first magnetic force generator is detected, wherein the magnetic field detection element is configured such that a position in the first direction coincides with the central axis of the winding of the first coil in a state in which the movable mechanism is at the reference position.

10. An image blur correction device that corrects blur of an image formed in an imaging element by an imaging optical system, the image blur correction device comprising:

a movable mechanism to which an optical component included in the imaging element or the imaging optical system is fixed;

a support mechanism that supports the movable mechanism to be movable in a first direction perpendicular to an optical axis of the imaging optical system; and a first drive mechanism that generates thrust of moving the movable mechanism in the first direction, wherein the first drive mechanism includes a first magnetic force generator that is fixed to one mechanism of the support mechanism and the movable mechanism and in which a direction connecting both magnetic poles is parallel to the first direction, and a first coil that is fixed to the other mechanism of the support mechanism and the movable mechanism to face the first magnetic force generator, in a state in which the movable mechanism is at a reference position where the optical axis of the imaging optical system coincides with a center of the imaging element, a position in the first direction of a center between both magnetic poles of the first magnetic force generator and a central axis of winding of the first coil deviate from each other, the support mechanism supports the movable mechanism to be movable in the first direction and a second direction perpendicular to the optical axis of the imaging optical system and the first direction, the image blur correction device comprises:

a second drive mechanism that generates thrust of moving the movable mechanism in the second direction, the second drive mechanism includes a second magnetic force generator that is fixed to one mechanism of the support mechanism and the movable mechanism and in which a direction connecting both magnetic poles is parallel to the second direction, and a second coil that is fixed to the other mechanism of the support mechanism and the movable mechanism to face the second magnetic force generator, and in a state in which the movable mechanism is at the reference position, a position of a center between both magnetic poles of the second magnetic force generator in the second direction coincides with a central axis of winding of the second coil.

\* \* \* \* \*